United States Patent
Bravo et al.

(10) Patent No.: US 7,589,278 B2
(45) Date of Patent: Sep. 15, 2009

(54) EMERGENCY POWER SUPPLY

(75) Inventors: Pablo Enrique Bravo, Bonita, CA (US); Clayton W. Haney, Camden, DE (US); Sunny Cardinal Huff, San Diego, CA (US); Luigi Umberto Ricci Moretti, Philadelphia, PA (US)

(73) Assignee: Apical Industries, Inc., Oceanside, CA (US)

( * ) Notice: Subject to any disclaimer, the term of this patent is extended or adjusted under 35 U.S.C. 154(b) by 480 days.

(21) Appl. No.: 11/361,553

(22) Filed: Feb. 24, 2006

(65) Prior Publication Data

US 2007/0201189 A1 Aug. 30, 2007

(51) Int. Cl.
*H01J 15/00* (2006.01)

(52) U.S. Cl. .................. 174/50.52; 439/76.1; 361/328; 307/10.1; 307/9.1

(58) Field of Classification Search ............. 174/50.52; 439/76.1, 620, 941; 361/328; 307/10.1, 307/9.1, 64, 66
See application file for complete search history.

(56) References Cited

U.S. PATENT DOCUMENTS

| | | | | |
|---|---|---|---|---|
| 2,425,607 A | | 8/1947 | Edwards et al. | |
| 2,975,336 A | * | 3/1961 | Schlafly | 361/191 |
| 4,702,094 A | * | 10/1987 | Peterson | 70/241 |
| 5,541,457 A | * | 7/1996 | Morrow | 307/38 |
| 5,606,247 A | | 2/1997 | Sutrina | |
| 6,231,077 B1 | | 5/2001 | Karolek et al. | |
| 6,327,144 B1 | * | 12/2001 | May | 361/687 |
| 6,339,296 B1 | * | 1/2002 | Goral | 315/86 |
| 2002/0100599 A1 | | 8/2002 | Rittmann et al. | |
| 2002/0199131 A1 | | 12/2002 | Kocin | |
| 2003/0085621 A1 | | 5/2003 | Potega | |
| 2008/0136374 A1 | * | 6/2008 | Nelson et al. | 320/128 |

FOREIGN PATENT DOCUMENTS

| | | |
|---|---|---|
| JP | 403099971 A | 4/1991 |
| JP | 406113490 A | 4/1994 |

* cited by examiner

*Primary Examiner*—Dhiru R Patel
(74) *Attorney, Agent, or Firm*—Peter K. Hahn; Luce, Forward, Hamilton & Scripps, LLP

(57) ABSTRACT

An emergency power supply for an electrical device that provides power sufficient to operate the emergency flotation system for a predetermined period of time after a malfunction of a primary power source. The emergency power supply includes at least one capacitor and a control circuit that are disposed in a housing that is sealed to prevent ingress of liquids. The emergency power supply remains functional even when it is partially submerged.

20 Claims, 4 Drawing Sheets

EMERGENCY POWER SUPPLY

FIELD OF THE INVENTION

The present invention is directed to an emergency power supply, and more particularly to an emergency power supply for operating an emergency flotation system on an aircraft.

BACKGROUND OF THE INVENTION

Emergency flotation devices are required on many aircraft to provide emergency assistance to passengers in the event the aircraft is forced down or must land in water. Emergency flotation devices generally include systems designed to float the aircraft, systems for deploying emergency life rafts and life vests for individual occupants. Oftentimes, the electrical systems on an aircraft, such as control systems and emergency systems, become inoperable due to a failure of the aircraft's main power system after exposure to water. Emergency flotation systems often require electrical power to deploy and a failure of the power system renders the flotation system inoperable if no backup power supply is available. As a result, various systems have been devised for providing emergency power to aircraft.

One commonly used method of providing backup power is to provide batteries that may be charged prior to or during flight. The batteries generally designed to allow a pilot sufficient power to maintain control over the aircraft until it can be safely landed after a failure of the main power system. Unfortunately, those battery systems are generally electrically connected with the main power system bus, which is generally too complex to isolate from the environment. In addition, the batteries themselves are not protected from exposure to the environment. As a result, the battery systems are susceptible to failure after being exposed to water.

Another example of a power system for an aircraft that is capable of providing emergency power is described in U.S. Pat. No. 5,606,247 to Sutrina as long as the engine is turning. The power system includes a mechanical gear drive that is driven by the aircraft's engine and a plurality of U-shaped cores each of which have two legs separated by a gap. A coil is wound on a portion of each core and an electronic converter selectively couples and decouples the coil from a dc power source. The relative motion between the gear teeth and the cores generates power. A disadvantage of the system is that the mechanical gears must rotate in order to generate power, which requires operation of the engine, and the engine is susceptible to failure from exposure to water. As a result, if the aircraft were to land in water and the engine ceased to operate no power could be supplied by the system.

In view of the above, there exists a need for an emergency power supply for an emergency flotation system that is not susceptible to failure from exposure to water.

SUMMARY OF THE INVENTION

In view of the foregoing, it is an object of the present invention to provide an emergency power supply for an aircraft's emergency flotation system that is capable of operating when it is partially submerged in water.

It is another object of the invention to provide an emergency power supply that is capable of supplying enough power to activate electrical valves of an emergency flotation system after a loss of main power.

It is another object of the invention to provide an emergency power supply that is capable of supplying power to activate valves of an emergency flotation system for a predetermined duration of time after a loss of main power.

In the preferred embodiment of the invention, an emergency power supply includes a plurality of capacitors that are housed in a sealed container. The capacitors are coupled through a water resistant connector to at least one valve in an emergency flotation system. The emergency power supply is configured so that if the aircraft becomes submerged in water during a crash or an emergency landing, and the main power system of the aircraft is not functional, an onboard emergency flotation device may be operated by power supplied from the emergency power supply. The supply is sealed so that for at least a predetermined amount of time, the emergency power supply will remain operable. It should be appreciated that "aircraft" as used herein is intended to refer to any flying device, such as, for example, airplanes and helicopters.

These and other features and advantages of the present invention will be appreciated from review of the following detailed description of the invention, along with the accompanying figures in which like reference numerals refer to like parts throughout.

DETAILED DESCRIPTION

In the following paragraphs, the present invention will be described in detail by way of example with reference to the attached drawings. Throughout this description, the preferred embodiment and examples shown should be considered as exemplars, rather than as limitations on the present invention. As used herein, the "present invention" refers to any one of the embodiments of the invention described herein, and any equivalents. Furthermore, reference to various feature(s) of the "present invention" throughout this document does not mean that all claimed embodiments or methods must include the referenced feature(s).

Figure 1:
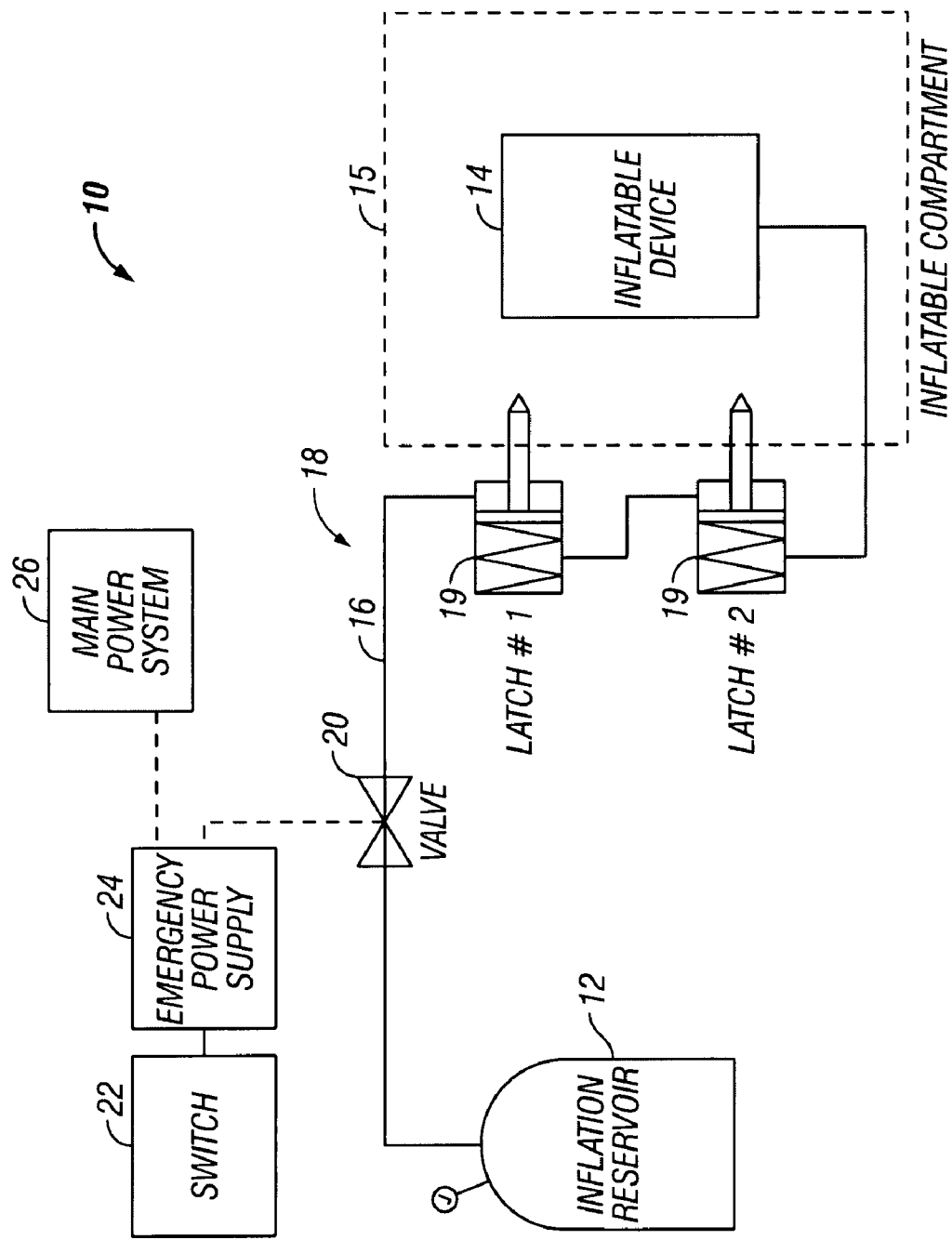
FIG. 1 is a schematic of an embodiment of an emergency flotation system incorporating emergency power supply in accordance with the present invention.

Referring to FIG. 1, a schematic of an emergency flotation system 10 will be described. Emergency flotation system 10 includes a pressurized fluid source, such as an inflation reservoir 12 that stores a pressurized gas, such as air or nitrogen, for selectively inflating an inflatable device 14, such as a life raft that is stored in an emergency compartment 15. A pressure line 16 fluidly links inflation reservoir 12 with a latching assembly 18 through a valve 20. Valve 20 is normally closed so that fluid communication between inflation reservoir 12 and a plurality of latches 19 included in latching assembly 18 is prevented. In an emergency, the system is activated by a switch 22 that causes valve 20 to switch to an open position so that inflation reservoir is placed in fluid communication with inflatable device 14 through latching assembly 18. Switch 22 is preferably an electronic switch that is located in the cockpit and valve 20 is operated electronically.

While FIG. 1 shows the incorporation of a latching assembly 18 between the valve 20 and inflatable device 14, the present invention could be used in conjunction with a system where there is no latching assembly 18. In that type of system a pressure line would connect the valve directly with the inflatable. Moreover, the skilled in the art will appreciate that the present emergency power supply could be used to power other systems requiring power of a predetermined strength and a limited duration.

Power for operating valve 20 is provided from an emergency power supply 24. Emergency power supply 24 is coupled to switch 22, valve 20 and a main power system 26 of the aircraft. As will be described in greater detail below, emergency power supply 24 is configured to provide emergency energy sufficient to operate valve 20 for a predetermined duration of time. A charge is maintained in emergency power supply 24 by main power system 26 during normal operation and during an emergency event in which main power system 26 is functional. However, during an emergency if main power system 26 becomes disabled, such as by being submerged, emergency power supply 24 is capable of supplying sufficient energy to operate valve 20 and emergency flotation system 10.

Figure 2:
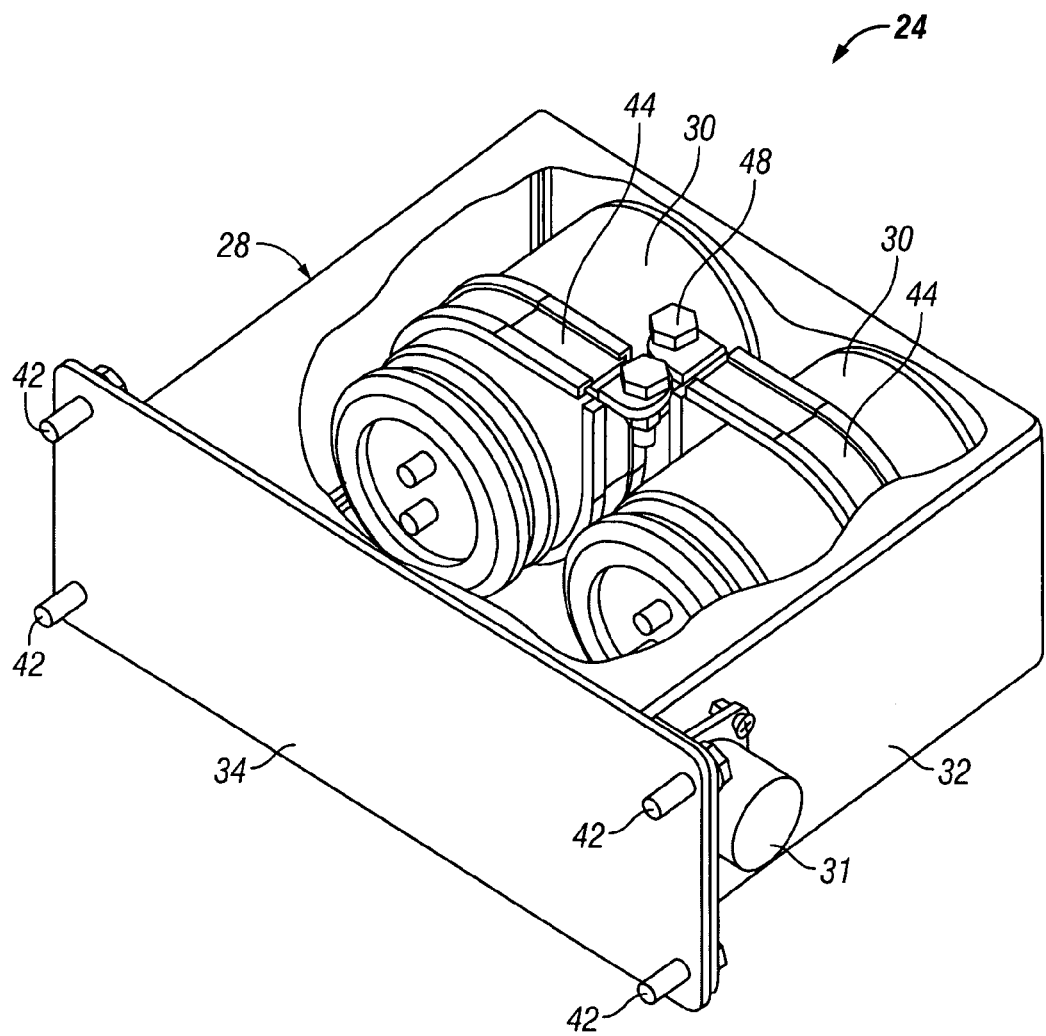
FIG. 2 is a perspective view of an emergency power supply according to the present invention with part of the housing removed so that its contents are visible.
Figure 3:
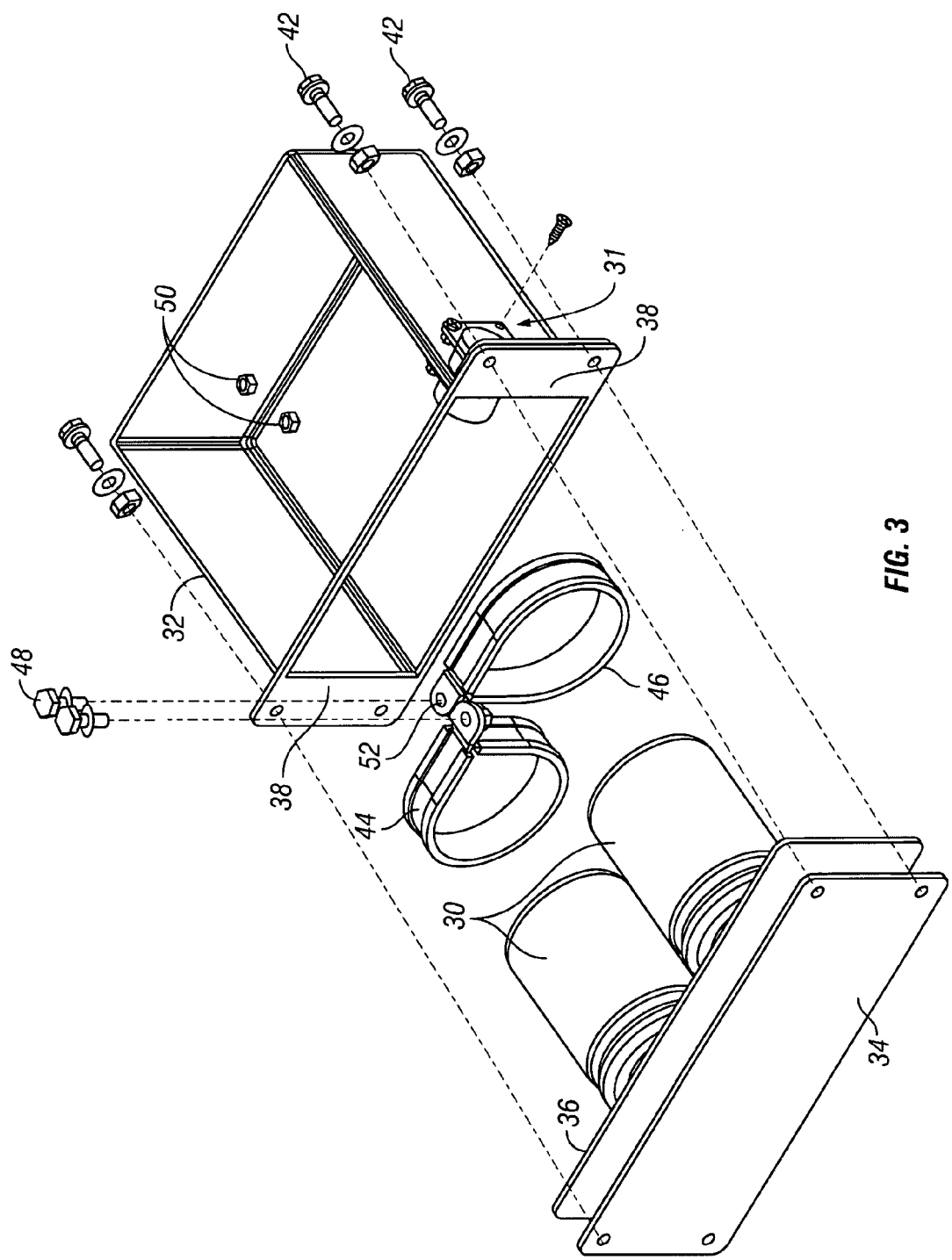
FIG. 3 is an exploded view of the emergency power supply of FIG. 2.

Referring to FIGS. 2 and 3, emergency power supply 24 will be described. Emergency power supply 24 generally includes a housing 28, one or more capacitors 30, a circuit board (not shown) and an electric connector 31. Housing 28 includes a body portion 32 and a cover 34 that are configured to be sealably coupled so that liquid is prevented from passing into housing 28. A sealing member 36 may be included between body portion 32 and cover 34 to seal the interface between body portion 32 and cover 34 while allowing cover 34 to be removed from body portion 32 if desired. Body portion 32 includes mounting flanges 38 that may be used to mount cover 34 onto body portion 32 with mechanical fasteners 42. It should be appreciated that flanges 38 may also be used to mount emergency power supply 24 to the aircraft if desired. It should be appreciated that cover 34 may also be permanently, or semi-permanently, coupled to body portion 32 such as by an adhesive or welding. Housing 28 may be constructed from any desired material such as plastic or metal and any welding or bonding technique known in the art that is appropriate for the chosen material may be used.

Preferably the system uses two capacitors 30. These capacitors 30 are mounted within housing 28 so that housing 28 isolates them from the environment. Clamp members 44 hold capacitors 30 in place within housing 28. Preferably, clamp members 44 are loop clamps and a respective clamp member 44 mounts each capacitor 30 within housing 28. Each clamp member 44 preferably also includes a compression member 46 so that the clamping force applied on each capacitor 30 by clamp member 44 may be maintained over time even if subjected to vibration or shock. Each clamp member 44 preferably is coupled to body portion 32 of housing 28 by a mechanical fastener 48 that extends through an aperture 50 in body portion and an aperture 52 in clamp member 44. Preferably, sealing members are included on fasteners 48 or in apertures 50 to prevent ingress of liquid into housing 28 through apertures 50. Alternatively, apertures 50 may be blind holes (i.e., configured so that they only extend partially through the thickness of body portion 32 from the inside of housing 28). It should be appreciated that clamp members 44 and/or compression members 46 also may be configured to provide shock and/or vibration damping so that capacitors are not damaged during either normal or emergency operation.

Any number, type and size of capacitor(s) may be used so long as the capacitor or capacitors is or are capable of storing sufficient energy to operate valve 20 or other electrical device over the desired duration of time. In one embodiment, each capacitor 30 has a capacitance of 68,000 uF and is capable of storing sufficient energy to operate valve 20 for at least seven (7) minutes. In multi-capacitor embodiments, the capacitors are preferably sized such that each capacitor can independently power the valve or other electrical device for the requisite period of time. In this manner, each capacitor can still provide sufficient power should one or more of the other capacitors fail.

Connector 31 provides an interface between emergency power supply 24 and main power system 26 and emergency flotation system 10. Connector 31 is coupled to a wall of body portion 32 of housing 28 and is water resistant or preferably waterproof so that liquid is prohibited from flowing into housing 28 through, or around, connector 31. For most applications, connector 31 is a multi-pin connector having two or more electrical lines. Connector 31 is preferably configured such that when connected to a mating connector (which is electrically connected to the valve or other electrical device), the connected mating connectors also prevent liquids from entering the connectors and shorting, at the connector interface, any of the lines passing through the connector. Any water resistant or waterproof connector may be used such as appropriate military standard electrical connectors.

Figure 4:
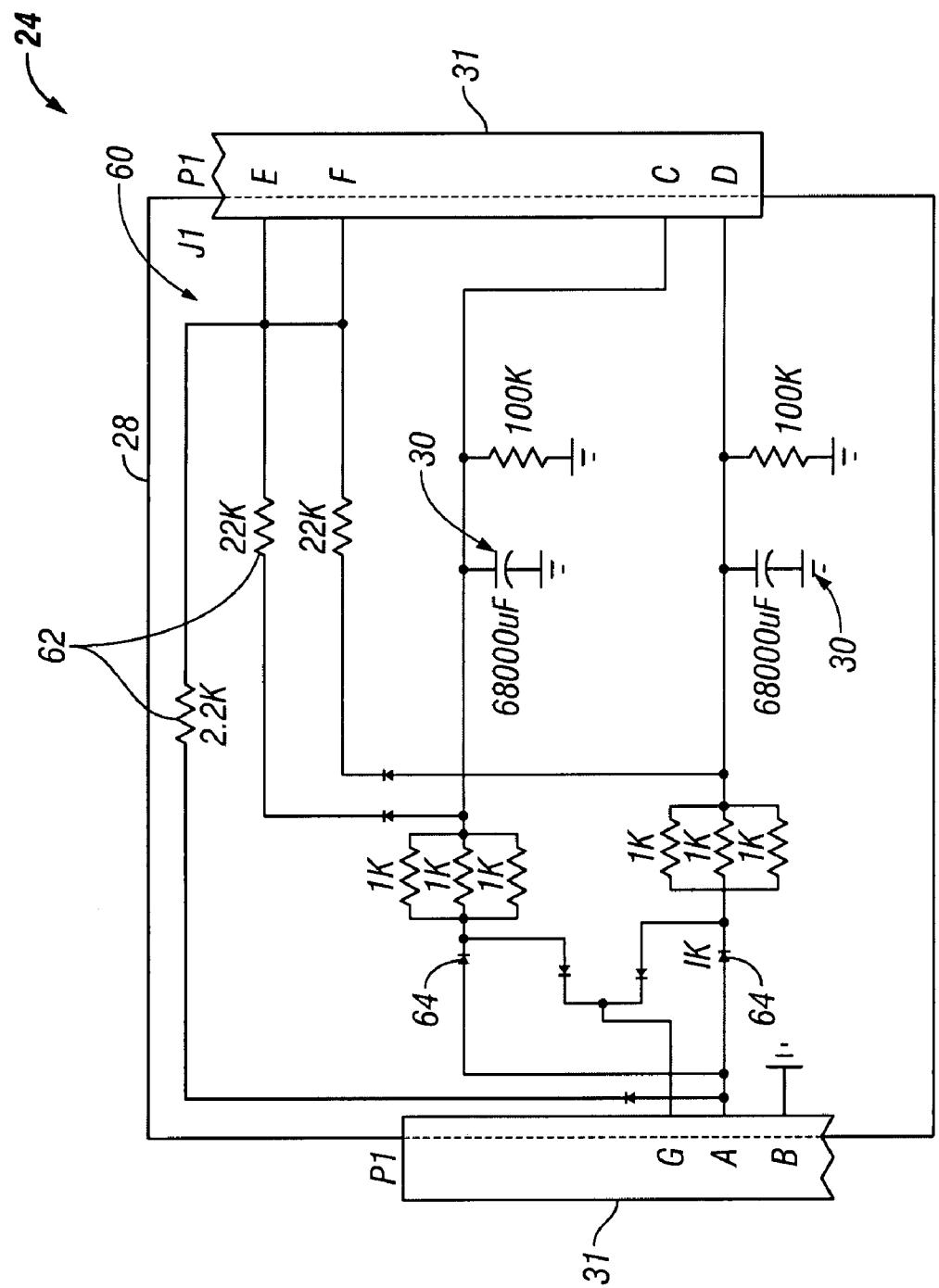
FIG. 4 is a circuit diagram of an embodiment of the emergency power supply of the present invention.

Emergency power supply 24 is shown schematically in FIG. 4. A control circuit 60 is contained within housing 28 and is used to electrically couple capacitors 30 with main power system 26 and the other components of emergency flotation system 10 through connector 31 (illustrated in two parts). Circuit 60 includes a plurality of resistors 62 and diodes 64 that are configured to regulate power flowing into and out of emergency power supply 24 as can be recognized by a person having ordinary skill in the art. Control circuit 60 may be any circuit that is capable of regulating the power flowing into and out of capacitors 30 and the circuit may include any components known in the art. Preferably, circuit 60 is incorporated onto a circuit board that is mounted in body portion 32 of housing 28.

During use of the aircraft an occupant such as a pilot arms emergency flotation system 10. While the system is armed and as long as the aircraft's main power system 26 is operating power is fed into emergency power supply 24 and continually stored within capacitors 30. If main power system 26, and/or any batteries, becomes inoperable, emergency power supply 24 retains sufficient power within capacitors 30 to electrically operate valve 20 of emergency flotation system 10 for a predetermined period of time. Preferably, emergency power supply 24 retains sufficient power to operate valve 20 for a period of 5-10 minutes and more preferably at least seven (7) minutes.

As noted above, most aircraft power systems are susceptible to malfunction if the aircraft becomes partially submerged in water. Because housing 28 is sealed from ingress of liquid, emergency power supply 24 is capable of operating even if it is partially submerged in water and emergency flotation system 10 remains operable.

One skilled in the art will appreciate that the present invention can be practiced by other than the various embodiments and preferred embodiments, which are presented in this description for purposes of illustration and not of limitation, and the present invention is limited only by the claims that follow. It is noted that equivalents for the particular embodiments discussed in this description may practice the invention as well.

What is claimed is:

1. An emergency power supply for an electrical device, said power supply comprising:

a housing sealed to prohibit ingress of liquid;

a capacitor disposed within the housing and chargeable by a primary power source, said capacitor being configured to provide power to said electrical device when said primary power source does not provide power; and a multi-pin connector that extends through the housing and is sealed to prohibit ingress of liquid into the housing, wherein the connector is configured to provide an electrical interface between the capacitor and the electrical device.

2. The emergency power supply of claim 1, further comprising a control circuit disposed within the housing, said control circuit being configured to selectively release power stored in the capacitor to operate the electrical device.

3. The emergency power supply of claim 2, wherein the control circuit is disposed on a circuit board that is mounted to the housing.

4. The emergency power supply of claim 1, further comprising a clamp member that couples the capacitor to the housing.

5. The emergency power supply of claim 4, wherein the clamp member is configured to dampen mechanical vibration.

6. The emergency power supply of claim 4, wherein the clamp member is configured to dampen mechanical shock.

7. The emergency power supply of claim 1, wherein the connector is water resistant.

8. The emergency power supply of claim 1, wherein the connector is waterproof.

9. The emergency power supply of claim 1, wherein the capacitor has a capacitance of approximately 68,000 uF.

10. An emergency power supply for an electrical device, said power supply comprising:
a housing sealed to prohibit ingress of liquid;
a control circuit disposed within the housing;
at least one capacitor disposed within the housing and electrically coupled to the control circuit and connectable to a primary power source; and
a connector configured to provide an electrical interface between the control circuit and the electrical device,
wherein the emergency power supply is configured to store sufficient power in the at least one capacitor to provide power to the electrical device for a predetermined period of time when the primary power source does not provide power.

11. The emergency power supply of claim 10, wherein the connector comprises a first part of a two part, multi-pin connector, said connector being sealed to prohibit ingress of liquid into the housing and being configured to prevent liquid from shorting across pins when said first part is connected to a second part of said two part connector.

12. The emergency power supply of claim 10, wherein the predetermined period of time is in the range of 5-10 minutes.

13. The emergency power supply of claim 10, wherein the predetermined period of time is approximately 7 minutes.

14. The emergency power supply of claim 10, wherein the control circuit is disposed on a circuit board that is mounted to the housing.

15. The emergency power supply of claim 10, wherein said at least one capacitor is a pair of capacitors each having sufficient capacitance to independently supply power to the electrical device for said predetermined period of time.

16. An emergency power supply for an electrical valve in an emergency inflation system, said power supply comprising:
a housing sealed to prohibit ingress of liquid;
a capacitor disposed within the housing and connected to a primary power source,
said capacitor being able to provide power to said electrical valve when said primary power source does not provide power; and
a first part of a two part, multi-pin connector, said connector being sealed to prohibit ingress of liquid into the housing and being configured to prevent liquid from shorting across pins when said first part is connected to a second part of said two part connector.

17. The emergency power supply of claim 16, further comprising a control circuit disposed within the housing, said control circuit being configured to selectively release power stored in the capacitor to operate the valve.

18. The emergency power supply of claim 17, wherein the control circuit is disposed on a circuit board that is mounted to the housing.

19. The emergency power supply of claim 18, further comprising a second capacitor, said second capacitor being disposed inside said housing and connected to said control circuit.

20. The emergency power supply of claim 19, wherein each of said capacitors has sufficient capacitance to independently supply power to the valve for a predetermined period of time.

* * * * *